(12) United States Patent
Ko et al.

(10) Patent No.: US 10,763,104 B2
(45) Date of Patent: Sep. 1, 2020

(54) METHOD OF FORMING DIFFERENTIAL ETCH STOP LAYER USING DIRECTIONAL PLASMA TO ACTIVATE SURFACE ON DEVICE STRUCTURE

(71) Applicant: Taiwan Semiconductor Manufacturing Co., Ltd., Hsinchu (TW)

(72) Inventors: Chung-Ting Ko, Kaohsiung (TW); Jr-Hung Li, Chupei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/874,618

(22) Filed: Jan. 18, 2018

(65) Prior Publication Data

US 2019/0096888 A1 Mar. 28, 2019

Related U.S. Application Data

(60) Provisional application No. 62/564,760, filed on Sep. 28, 2017.

(51) Int. Cl.
*H01L 21/02* (2006.01)
*H01L 21/3105* (2006.01)
(Continued)

(52) U.S. Cl.
CPC .... *H01L 21/02208* (2013.01); *H01L 21/0217* (2013.01); *H01L 21/0228* (2013.01);
(Continued)

(58) Field of Classification Search
CPC ......... H01L 21/76829; H01L 21/02208; H01L 21/02211; H01L 21/3105; H01L 21/02274; H01L 21/0228; H01L 21/762
See application file for complete search history.

(56) References Cited

U.S. PATENT DOCUMENTS

8,722,546 B2 5/2014 Fukazawa et al.
9,105,490 B2 8/2015 Wang et al.
(Continued)

FOREIGN PATENT DOCUMENTS

KR 20090012573 A 2/2009
TW 200901392 A 1/2009
(Continued)

*Primary Examiner* — Michael Jung
(74) *Attorney, Agent, or Firm* — Slater Matsil, LLP

(57) ABSTRACT

Methods of forming a differential layer, such as a Contact Etch Stop Layer (CESL), in a semiconductor device are described herein, along with structures formed by the methods. In an embodiment, a structure includes an active area on a substrate, a gate structure over the active area, a gate spacer along a sidewall of the gate structure, and a differential etch stop layer. The differential etch stop layer has a first portion along a sidewall of the gate spacer and has a second portion over an upper surface of the source/drain region. A first thickness of the first portion is in a direction perpendicular to the sidewall of the gate spacer, and a second thickness of the second portion is in a direction perpendicular to the upper surface of the source/drain region. The second thickness is greater than the first thickness.

20 Claims, 23 Drawing Sheets

(51) Int. Cl.
*H01L 27/092* (2006.01)
*H01L 21/768* (2006.01)
*H01L 29/66* (2006.01)
*H01L 21/762* (2006.01)
*H01L 29/423* (2006.01)
*H01L 29/78* (2006.01)

(52) U.S. Cl.
CPC .. *H01L 21/02211* (2013.01); *H01L 21/02274* (2013.01); *H01L 21/3105* (2013.01); *H01L 21/762* (2013.01); *H01L 21/76829* (2013.01); *H01L 27/0924* (2013.01); *H01L 29/4232* (2013.01); *H01L 29/66553* (2013.01); *H01L 29/66795* (2013.01); *H01L 29/785* (2013.01); *H01L 21/76224* (2013.01); *H01L 29/665* (2013.01)

(56) References Cited

U.S. PATENT DOCUMENTS

| | | | |
|---|---|---|---|
| 9,190,489 | B1 | 11/2015 | Mountsier et al. |
| 9,218,974 | B2 | 12/2015 | Chung et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,761,483 | B1 | 9/2017 | Chang et al. |
| 9,831,183 | B2 | 11/2017 | Lin et al. |
| 9,859,386 | B2 | 1/2018 | Ho et al. |
| 2006/0189053 | A1 | 8/2006 | Wang et al. |
| 2009/0032881 | A1 | 2/2009 | Lee et al. |
| 2009/0246367 | A1* | 10/2009 | Huotari ............ B82Y 30/00 427/215 |
| 2010/0210108 | A1* | 8/2010 | Ishizaka ............ C23C 16/047 438/674 |
| 2011/0198736 | A1* | 8/2011 | Shero ............... B82Y 30/00 257/629 |
| 2014/0035048 | A1 | 2/2014 | Lee et al. |
| 2014/0217517 | A1 | 8/2014 | Cai et al. |
| 2015/0037980 | A1* | 2/2015 | Rha ................. H01L 21/306 438/700 |
| 2015/0364559 | A1* | 12/2015 | Wang ............. H01L 21/76834 257/401 |
| 2015/0380558 | A1 | 12/2015 | Huang |
| 2016/0005839 | A1* | 1/2016 | Yieh ............. H01L 29/66803 438/506 |
| 2016/0020300 | A1* | 1/2016 | Tsai ............. H01L 29/66636 438/299 |
| 2016/0043035 | A1 | 2/2016 | Lin et al. |
| 2016/0064275 | A1* | 3/2016 | Liu ............... H01L 21/76883 438/608 |
| 2016/0172189 | A1* | 6/2016 | Tapily ........... H01L 21/02315 438/778 |
| 2017/0110536 | A1 | 4/2017 | Hsiao et al. |
| 2017/0250068 | A1 | 8/2017 | Ishikawa et al. |
| 2017/0358491 | A1 | 12/2017 | Zhou et al. |
| 2018/0102280 | A1* | 4/2018 | Nguyen ......... H01L 21/76814 |

FOREIGN PATENT DOCUMENTS

| | | |
|---|---|---|
| TW | 201432847 A | 8/2014 |
| TW | 201721755 A | 6/2017 |
| WO | 2017048259 A1 | 3/2017 |

* cited by examiner

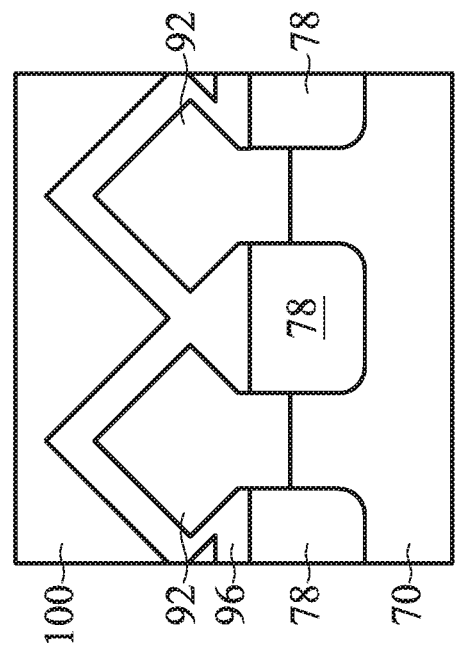
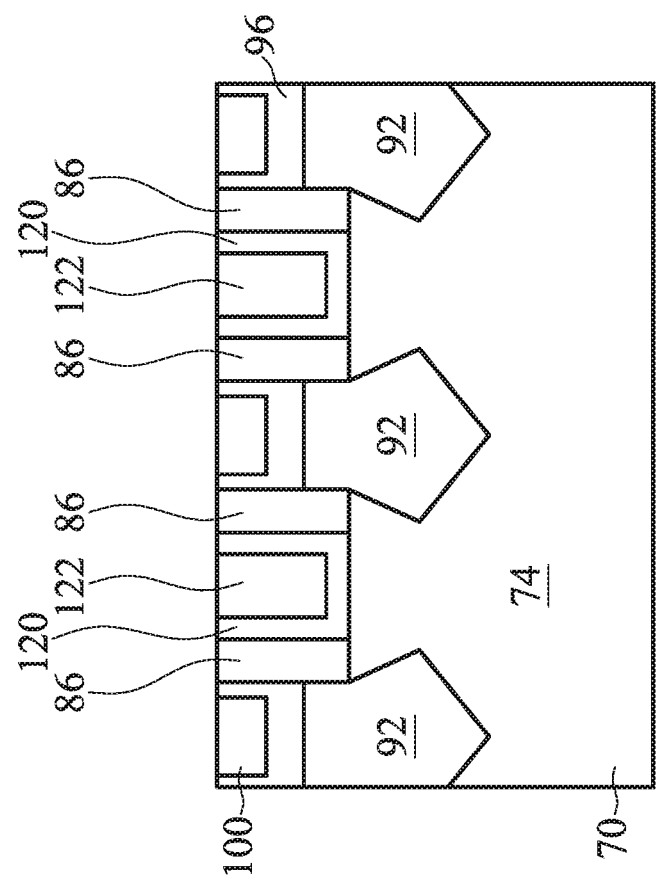
FIG. 13B
FIG. 13A

US 10,763,104 B2

METHOD OF FORMING DIFFERENTIAL ETCH STOP LAYER USING DIRECTIONAL PLASMA TO ACTIVATE SURFACE ON DEVICE STRUCTURE

PRIORITY CLAIM AND CROSS-REFERENCE

This application claims the benefit of and priority to U.S. Provisional Patent Application No. 62/564,760, filed on Sep. 28, 2017, entitled "Differential Layer Formation Processes and Structures Formed Thereby," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-B, 14A-B, 15A-B, and 16A-B are cross-sectional views of respective intermediate structures at intermediate stages in another example process of forming a semiconductor device in accordance with some embodiments.

DETAILED DESCRIPTION

Figure 1:
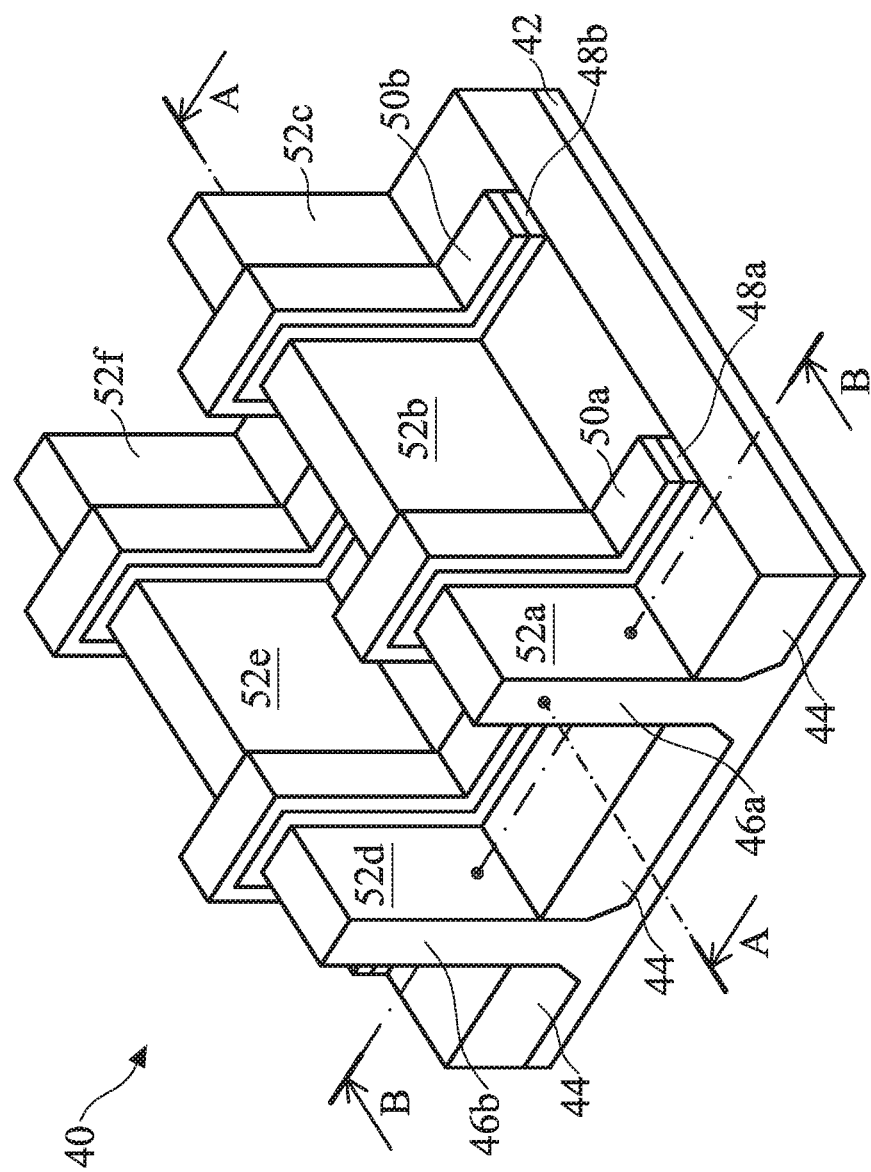
FIG. 1 is a three-dimensional view of example simplified Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of forming a differential layer, such as a Contact Etch Stop Layer (CESL), in a semiconductor device, such as including a Fin Field-Effect Transistor (FinFET), are described herein, along with structures formed by the methods. Generally, a direction plasma activation process is implemented which permits some portions of a differential layer (e.g., on an upper surface having a horizontal component) to be deposited at a greater rate than other portions (e.g., on a vertical surface without a significant horizontal component). Hence, some portions of the differential layer can have a greater thickness than other portions of the differential layer. The differential layer may permit for greater protection of source/drain regions and/or may increase a process window for the formation of other components or features, among other possible advantages.

Example embodiments described herein are described in the context of forming a CESL on FinFETs. Implementations of some aspects of the present disclosure may be used to form a layer that is not an etch stop layer. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 illustrates an example of simplified FinFETs 40 in a three-dimensional view. Other aspects not illustrated in or described with respect to FIG. 1 may become apparent from the following figures and description. The structure in FIG.

1 may be electrically connected or coupled in a manner to operate as, for example, one transistor or more, such as four transistors.

The FinFETs 40 comprise fins 46a and 46b on a substrate 42. The substrate 42 includes isolation regions 44, and the fins 46a and 46b each protrude above and from between neighboring isolation regions 44. Gate dielectrics 48a and 48b are along sidewalls and over top surfaces of the fins 46a and 46b, and gate electrodes 50a and 50b are over the gate dielectrics 48a and 48b, respectively. Source/drain regions 52a-f are disposed in respective regions of the fins 46a and 46b. Source/drain regions 52a and 52b are disposed in opposing regions of the fin 46a with respect to the gate dielectric 48a and gate electrode 50a. Source/drain regions 52b and 52c are disposed in opposing regions of the fin 46a with respect to the gate dielectric 48b and gate electrode 50b. Source/drain regions 52d and 52e are disposed in opposing regions of the fin 46b with respect to the gate dielectric 48a and gate electrode 50a. Source/drain regions 52e and 52f are disposed in opposing regions of the fin 46b with respect to the gate dielectric 48b and gate electrode 50b.

In some examples, four transistors may be implemented by: (1) source/drain regions 52a and 52b, gate dielectric 48a, and gate electrode 50a; (2) source/drain regions 52b and 52c, gate dielectric 48b, and gate electrode 50b; (3) source/drain regions 52d and 52e, gate dielectric 48a, and gate electrode 50a; and (4) source/drain regions 52e and 52f, gate dielectric 48b, and gate electrode 50b. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 52a-f are electrically connected, such as through coalescing the regions by epitaxial growth (e.g., source/drain regions 52a and 52d being coalesced, source/drain regions 52b and 52e being coalesced, etc.), two functional transistors may be implemented. Other configurations in other examples may implement other numbers of functional transistors.

FIG. 1 further illustrates reference cross-sections that are used in later figures. Cross-section A-A is in a plane along, e.g., channels in the fin 46a between opposing source/drain regions 52a-f. Cross-section B-B is in a plane perpendicular to cross-section A-A and is across source/drain region 52a in fin 46a and across source/drain region 52d in fin 46b. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

FIGS. 2A-B through 12A-B are cross-sectional views of respective intermediate structures at intermediate stages in an example process of forming a semiconductor device in accordance with some embodiments. Aspects of FIGS. 2A-B through 10A-B are applicable to a gate-first process and to a replacement gate process as described herein. FIGS. 11A-B and 12A-B illustrate further aspects of a gate-first process as described herein.

Figure 2A:
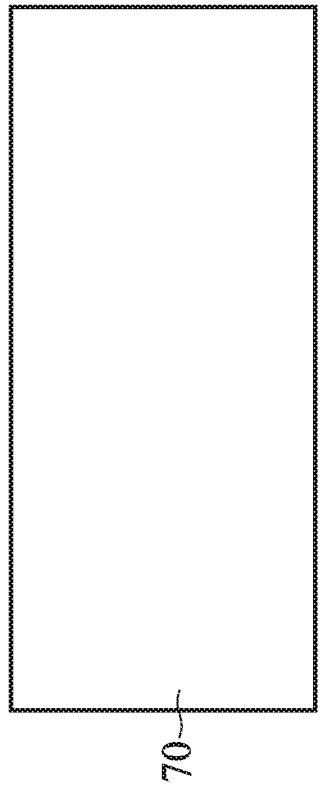
FIGS. 2A-B, 3A-B, 4A-B, 5A-B, 6A-B, 7A-B, 8A-B, 9A-B, 10A-B, 11A-B, and 12A-B are cross-sectional views of respective intermediate structures at intermediate stages in an example process of forming a semiconductor device in accordance with some embodiments.
Figure 2B:
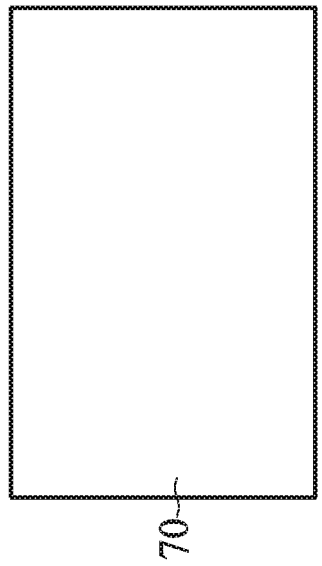

FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3B:
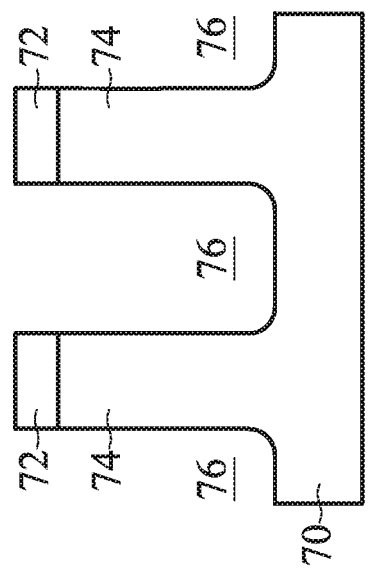
Figure 3A:
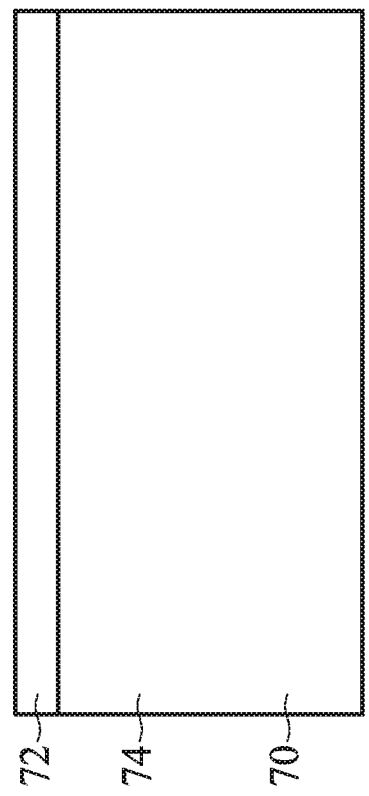

FIGS. 3A and 3B illustrate the formation of fins 74 in the semiconductor substrate 70. In some examples, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, ICP etch, the like, or a combination thereof. The etching may be anisotropic.

Figure 4B:
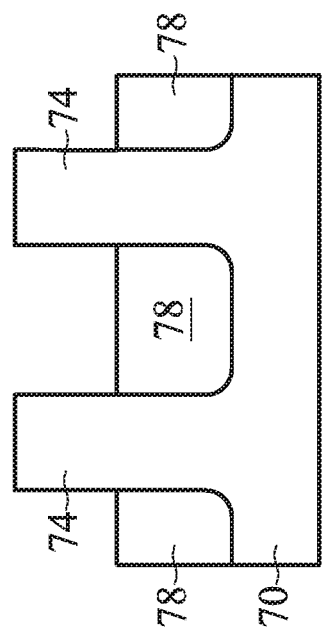
Figure 4A:
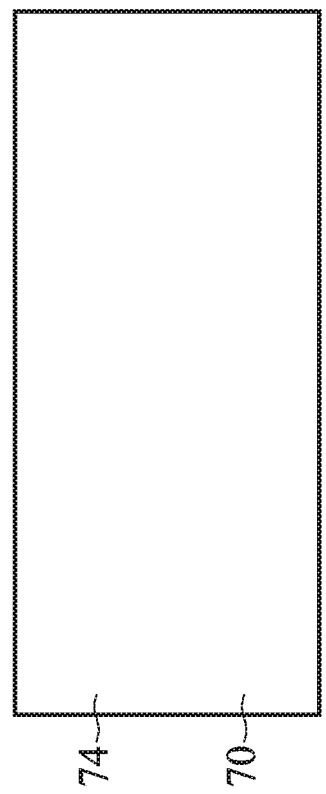

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a Chemical Mechanical Polish (CMP), may remove any excess insulating material and any remaining mask (e.g., used to etch the trenches 76 and form the fins 74) to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the processes described with respect to FIGS. 2A-B through 4A-B are just examples of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating material), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

Figure 5B:
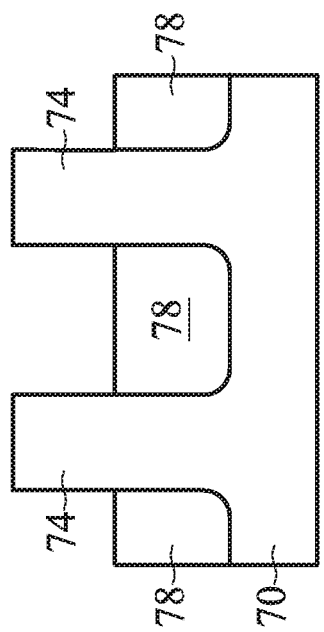
Figure 5A:
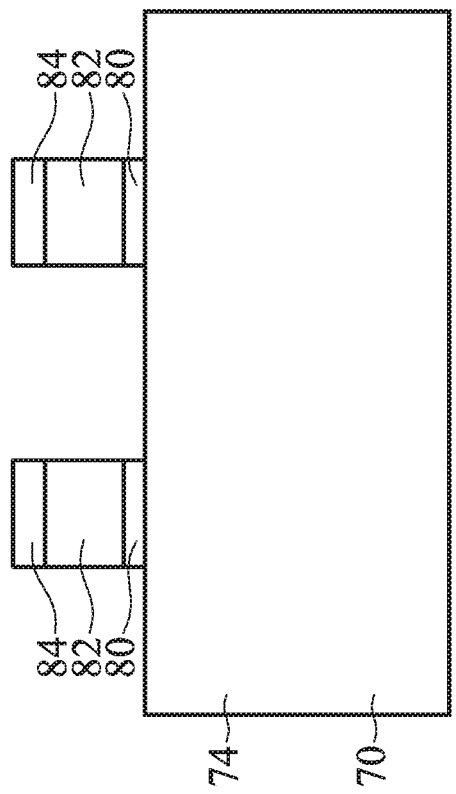

FIGS. 5A and 5B illustrate the formation of gate stacks on the fins 74. The gate stacks are over and extend laterally perpendicularly to the fins 74. Each gate stack comprises a dielectric layer 80, a gate layer 82, and a mask 84. The gate stacks can be operational gate stacks in a gate-first process or can be dummy gate stacks in a replacement gate process.

In a gate-first process, the dielectric layer 80 may be a gate dielectric, and the gate layer 82 may be a gate electrode. The gate dielectrics, gate electrodes, and mask 84 for the gate stacks may be formed by sequentially forming respective layers, and then patterning those layers into the gate stacks. For example, a layer for the gate dielectrics may include or be silicon oxide, silicon nitride, a high-k dielectric material, the like, or multilayers thereof. A high-k dielectric material can have a k value greater than about 7.0, and may include a metal oxide or silicate of Hf, Al, Zr, La, Mg, Ba, Ti, Pb, multilayers thereof, or a combination thereof. The layer for the gate dielectrics may be thermally and/or chemically grown on the fins 74, or conformally deposited, such as by plasma-enhanced CVD (PECVD), ALD, molecular-beam deposition (MBD), or another deposition technique. A layer for the gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The layer for the gate electrodes may be deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, gate electrodes, and gate dielectrics may then be patterned, for example, using photolithography and one or more etch processes, like described above, to form the mask 84, gate layers 82, and dielectric layers 80 for each gate stack.

In a replacement gate process, the dielectric layer 80 may be an interfacial dielectric, and the gate layer 82 may be a dummy gate. The interfacial dielectric, dummy gate, and mask 84 for the gate stacks may be formed by sequentially forming respective layers, and then patterning those layers into the gate stacks. For example, a layer for the interfacial dielectrics may include or be silicon oxide, silicon nitride, the like, or multilayers thereof, and may be thermally and/or chemically grown on the fins 74, or conformally deposited, such as by PECVD, ALD, or another deposition technique. A layer for the dummy gates may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gates, and interfacial dielectrics may then be patterned, for example, using photolithography and one or more etch processes, like described above, to form the mask 84, gate layer 82, and dielectric layers 80 for each gate stack.

In some embodiments, after forming the gate stacks, lightly doped drain (LDD) regions (not specifically illustrated) may be formed in the active areas. For example, dopants may be implanted into the active areas using the gate stacks as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 6B:
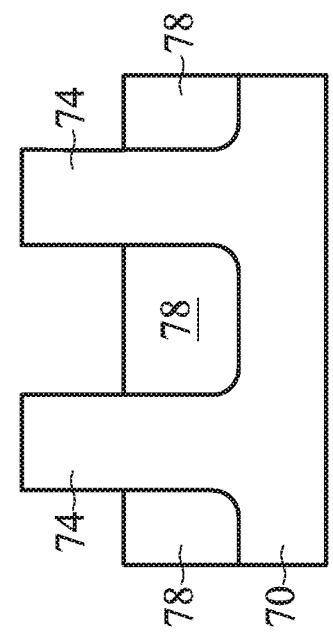
Figure 6A:
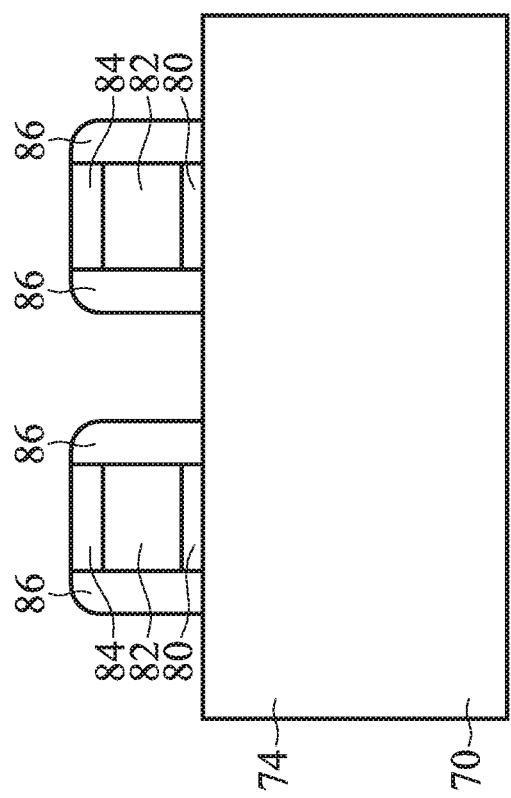

FIGS. 6A and 6B illustrate the formation of gate spacers 86. Gate spacers 86 are formed along sidewalls of the gate stacks (e.g., sidewalls of the dielectric layer 80, gate layer 82, and mask 84) and over the fins 74. Residual gate spacers 86 may also be formed along sidewalls of the fins 74, for example, depending on the height of the fins 74 above the isolation regions 78. The gate spacers 86 may be formed by conformally depositing one or more layers for the gate spacers 86 and anisotropically etching the one or more layers, for example. The one or more layers for the gate spacers 86 may include or be silicon carbon oxide, silicon nitride, silicon oxynitride, silicon carbon nitride, the like, multi-layers thereof, or a combination thereof, and may be deposited by CVD, ALD, or another deposition technique. The etch process can include a RIE, NBE, or another etch process.

Figure 7A:
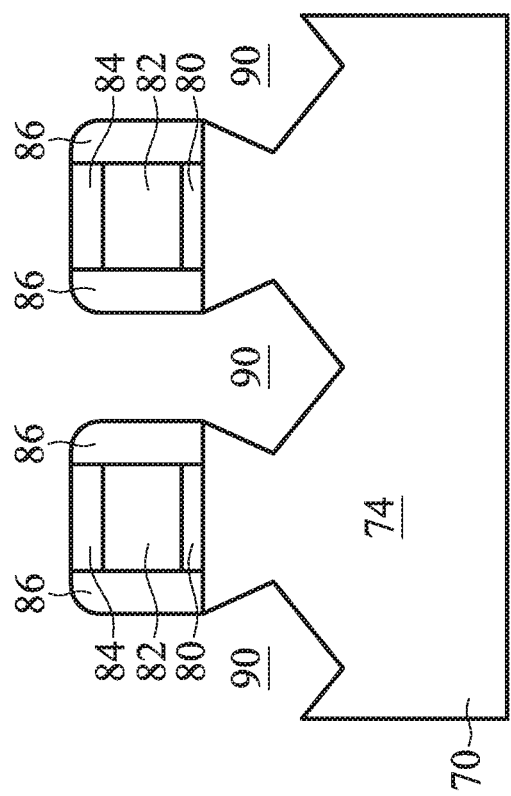
Figure 7B:
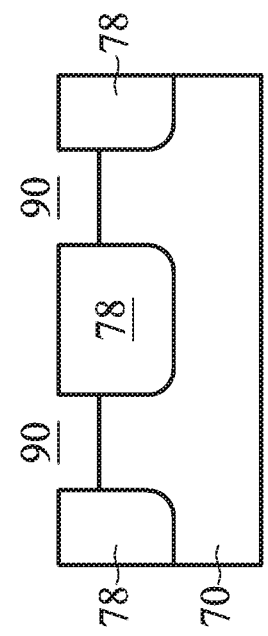

FIGS. 7A and 7B illustrate the formation of recesses 90 for source/drain regions. As illustrated, the recesses 90 are formed in the fins 74 on opposing sides of the gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

Figure 8B:
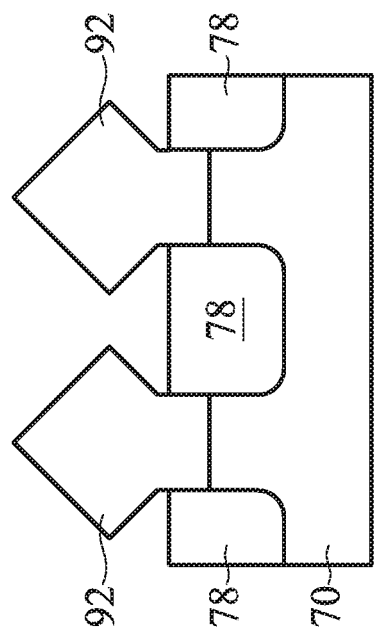
Figure 8A:
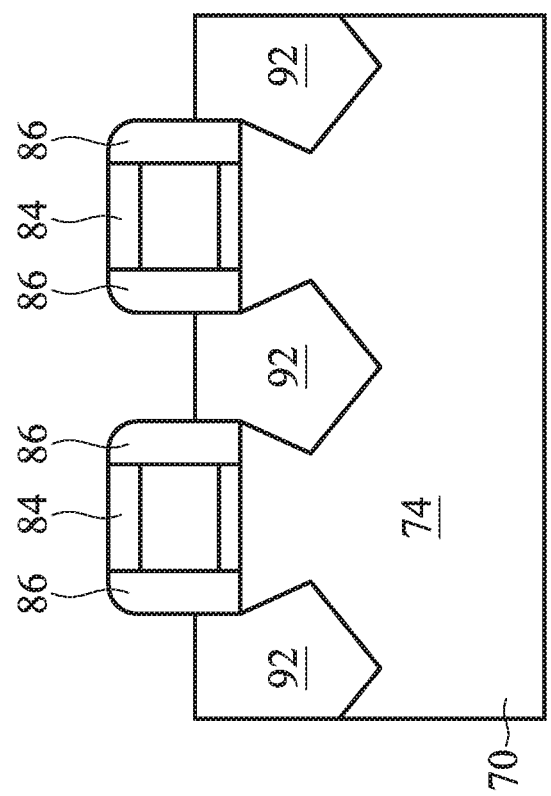

FIGS. 8A and 8B illustrate the formation of epitaxy source/drain regions 92 in the recesses 90. The epitaxy source/drain regions 92 may include or be silicon germanium (Si$_x$Ge$_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-B and 8A-B may be omitted, and that source/drain regions may be formed by implanting dopants into the fins 74 using the gate stacks and gate spacers 86 as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 9B:
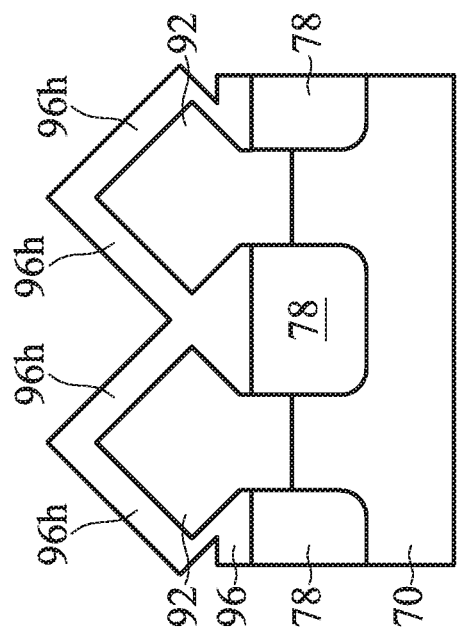
Figure 9A:
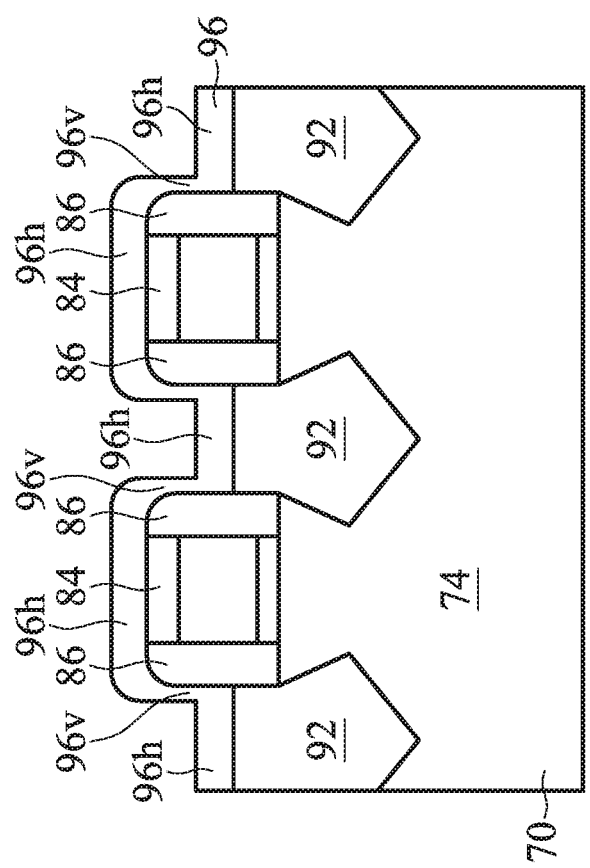

FIGS. 9A and 9B illustrate the formation of a differential contact etch stop layer (CESL) 96. Generally, an etch stop layer can provide a mechanism to stop an etch process when forming, e.g., contacts or vias. An etch stop layer may be formed of a dielectric material having a different etch selectivity from adjacent layers or components. The differential CESL 96 is formed on surfaces of the epitaxy source/drain regions 92, sidewalls and top surfaces of the gate spacers 86, top surfaces of the mask 84, and top surfaces of the isolation regions 78. The differential CESL 96 has horizontal portions 96h and vertical portions 96v. The horizontal portions 96h are formed on supporting surfaces that have respective horizontal components. The supporting surfaces with a horizontal component can be activated by a directional plasma activation during the formation of the differential CESL 96, as described in further detail below.

The vertical portions 96v are formed on supporting surfaces that do not have a significant horizontal component (e.g., such that those surfaces are not activated by the directional plasma activation). The horizontal portions 96h have a thickness (e.g., in a direction perpendicular to respective supporting surfaces) that is greater than a thickness of the vertical portions 96v (e.g., in a direction perpendicular to respective supporting surfaces). The differential CESL 96 may comprise or be silicon nitride, silicon carbon nitride, carbon nitride, the like, or a combination thereof. The differential CESL 96 may be deposited by a deposition process including a directional plasma activation, such as a Plasma Enhanced ALD (PEALD), CVD, or another deposition technique. Additional details of example deposition processes and a differential CESL 96 are described below, such as with respect to FIGS. 17 through 23.

Figure 10B:
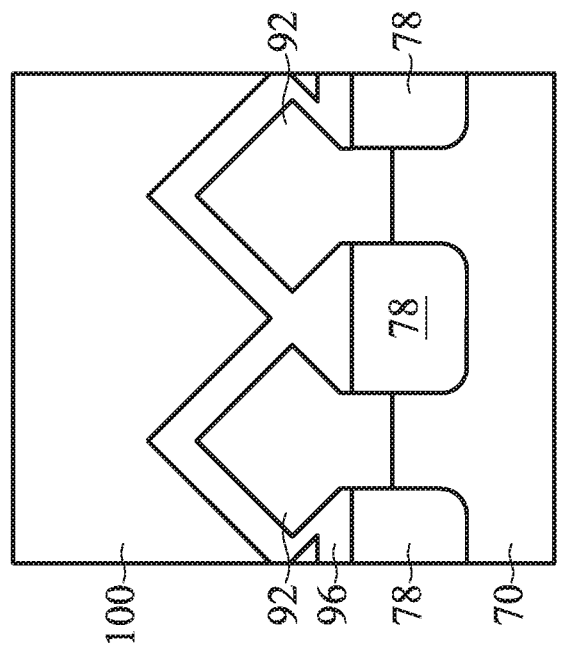
Figure 10A:
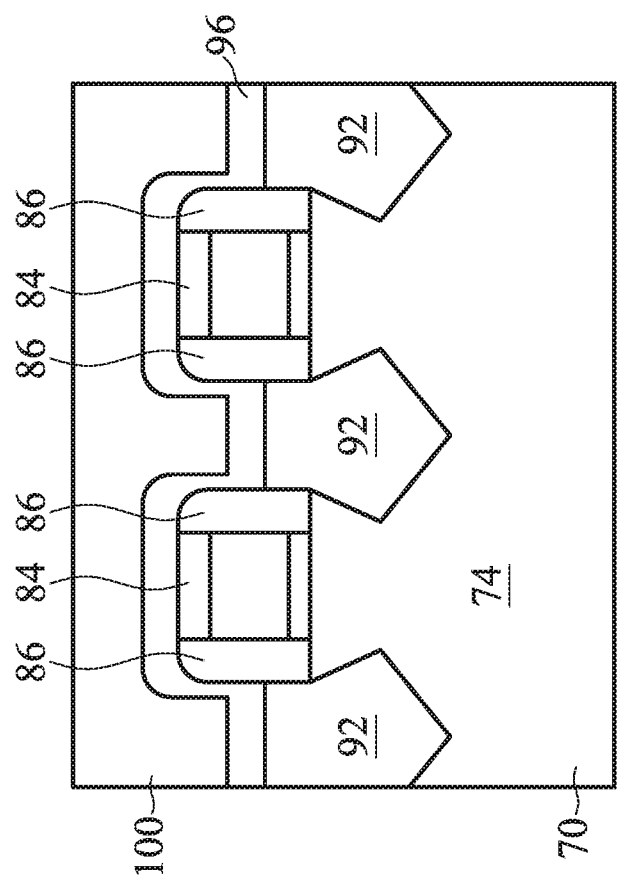

FIGS. 10A and 10B illustrate the formation of a first interlayer dielectric (ILD) 100 over the differential CESL 96. The first ILD 100 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The interlayer dielectric may be deposited by spin-on, CVD, FCVD, PECVD, PVD, or another deposition technique.

The first ILD 100 may be planarized after being deposited, such as by a CMP. In a gate-first process, a top surface of the first ILD 100 may be above the upper portions of the differential CESL 96 and the gate stacks. Hence, the upper portions of the differential CESL 96 may remain over the gate stacks.

Figure 11B:
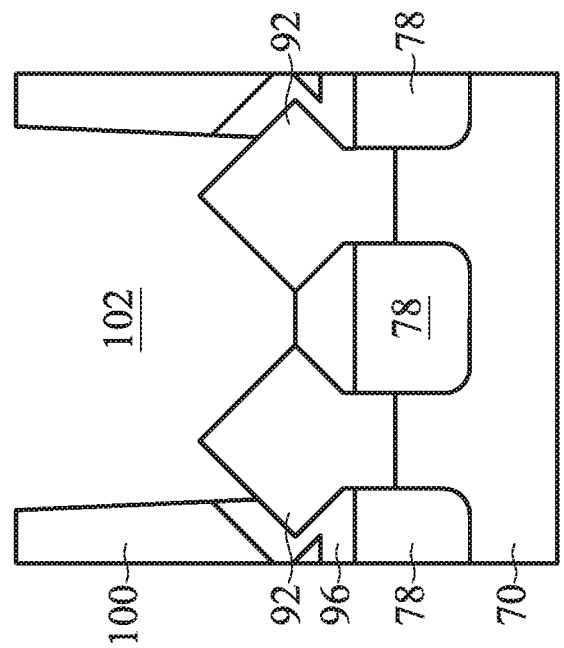
Figure 11A:
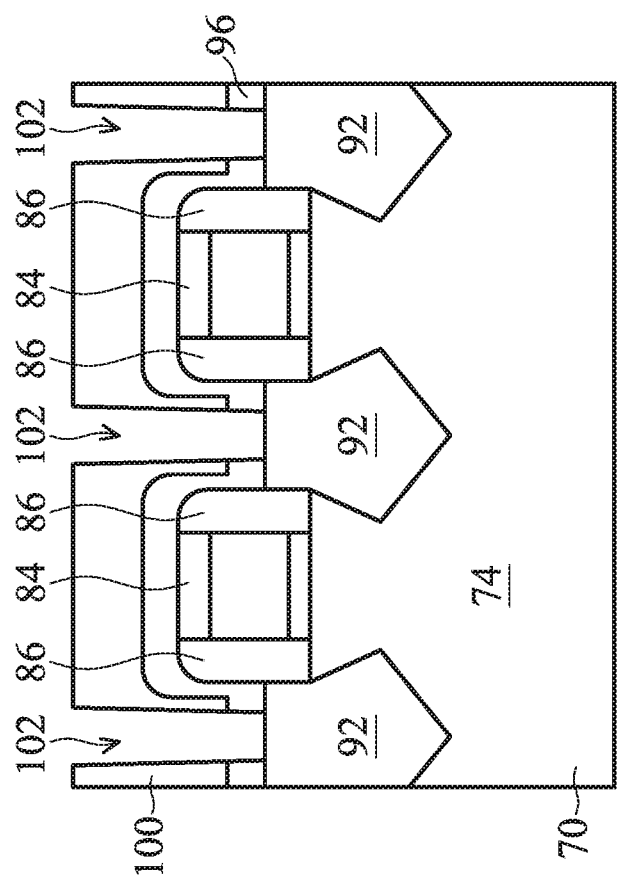

FIGS. 11A and 11B illustrate the formation of openings 102 through the first ILD 100 and the differential CESL 96 to the epitaxy source/drain regions 92 to expose at least portions of the epitaxy source/drain regions 92, as an example. The first ILD 100 and the differential CESL 96 may be patterned with the openings 102, for example, using photolithography and one or more etch processes.

Figure 12B:
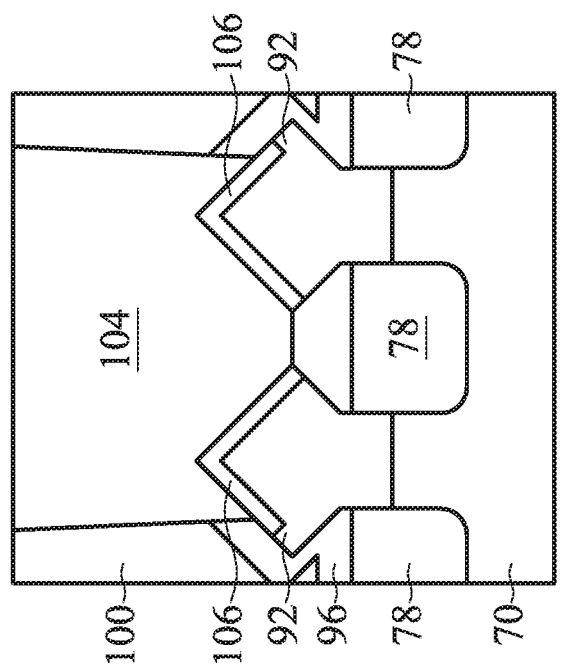
Figure 12A:
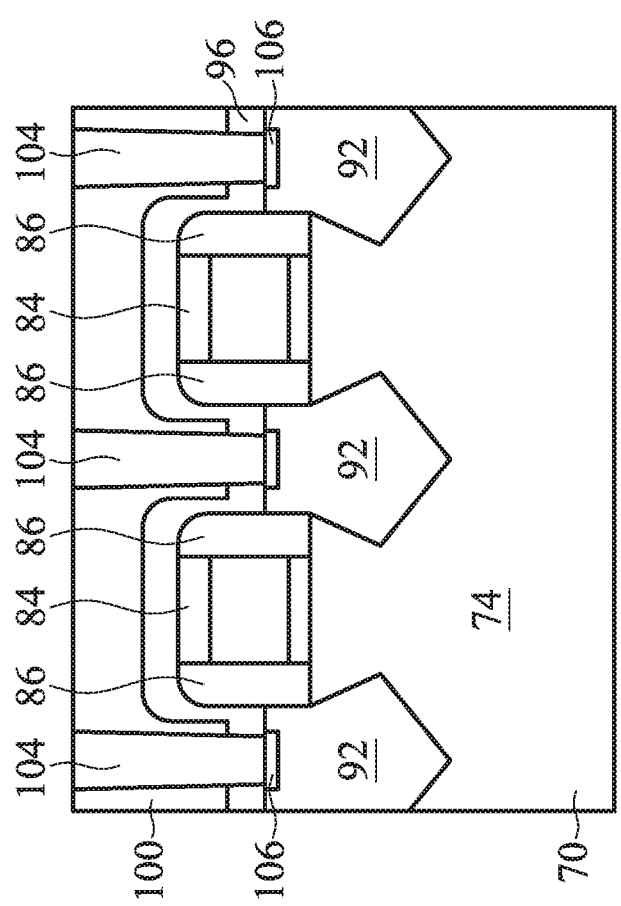

FIGS. 12A and 12B illustrate the formation of conductive features 104 in the openings 102 to the epitaxy source/drain regions 92. The conductive features 104 may include an adhesion and/or barrier layer and conductive material on the adhesion and/or barrier layer, for example. In some examples, the conductive features 104 may include silicide regions 106 on the epitaxy source/drain regions 92, as illustrated. The adhesion and/or barrier layer can be conformally deposited in the openings 102 and over the first ILD 100. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions 106 may be formed on upper portions of the epitaxy source/drain regions 92 by reacting upper portions of the epitaxy source/drain regions 92 with the adhesion and/or barrier layer. An anneal can be performed to facilitate the reaction of the epitaxy source/drain regions 92 with the adhesion and/or barrier layer.

The conductive material can be deposited on the adhesion and/or barrier layer and fill the openings 102. The conductive material may be or comprise tungsten, copper, aluminum, gold, silver, alloys thereof, the like, or a combination thereof, and may be deposited by CVD, ALD, PVD, or another deposition technique. After the material of the conductive features 104 is deposited, excess material may be removed by using a planarization process, such as a CMP, for example. The planarization process may remove excess material of the conductive features 104 from above a top surface of the first ILD 100. Hence, top surfaces of the conductive features 104 and the first ILD 100 may be coplanar. The conductive features 104 may be or may be referred to as contacts, plugs, etc.

FIGS. 13A-B through 16A-B are cross-sectional views of respective intermediate structures at intermediate stages in another example process of forming a semiconductor device in accordance with some embodiments. FIGS. 13A-B and 16A-B illustrate further aspects of a replacement gate process as described herein. Processing is first performed as described above with respect FIGS. 2A-B through 10A-B.

FIGS. 13A and 13B illustrate the replacement of gate stacks with replacement gate structures. The first ILD 100 and differential CESL 96 are formed with top surfaces coplanar with top surfaces of the gate layers 82. A planarization process, such as a CMP, may be performed to level the top surface of the first ILD 100 and differential CESL 96 with the top surfaces of the gate layers 82. The CMP may also remove the mask 84 (and, in some instances, upper portions of the gate spacers 86) on the gate layers 82. Accordingly, top surfaces of the gate layers 82 are exposed through the first ILD 100 and the differential CESL 96.

With the gate layers 82 exposed through the first ILD 100 and the differential CESL 96, the gate layers 82 and the dielectric layers 80 are removed, such as by one or more etch processes. The gate layers 82 may be removed by an etch process selective to the gate layers 82, wherein the dielectric layers 80 act as etch stop layers, and subsequently, the dielectric layers 80 can be removed by a different etch process selective to the dielectric layers 80. The etch processes can be, for example, a RIE, NBE, a wet etch, or another etch process. Recesses are formed between gate spacers 86 where the gate stacks are removed, and channel regions of the fins 74 are exposed through the recesses.

The replacement gate structures are formed in the recesses formed where the gate stacks were removed. The replacement gate structures each include one or more conformal layers 120 and a gate electrode 122. The one or more conformal layers 120 include a gate dielectric layer and may include one or more work-function tuning layers. The gate dielectric layer can be conformally deposited in the recesses where gate stacks were removed (e.g., on top surfaces of the isolation regions 78, sidewalls and top surfaces of the fins 74 along the channel regions, and sidewalls of the gate spacers 86) and on the top surfaces of the first ILD 100, the differential CESL 96, and gate spacers 86. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes 122 is formed over the one or more conformal layers 120. The layer for the gate electrodes 122 can fill remaining recesses where the gate stacks were removed. The layer for the gate electrodes 122 may be or comprise a metal-containing material such as Co, Ru, Al, W, Cu. multi-layers thereof, or a combination thereof. The layer for the gate electrodes 122 can be deposited by ALD, PECVD, MBD, PVD, or another deposition technique.

Portions of the layer for the gate electrodes 122 and of the one or more conformal layers 120 above the top surfaces of the first ILD 100, the differential CESL 96, and gate spacers 86 are removed. For example, a planarization process, like a CMP, may remove the portions of the layer for the gate electrodes 122 and the one or more conformal layers 120 above the top surfaces of the first ILD 100, the differential CESL 96, and gate spacers 86. The replacement gate structures comprising the gate electrodes 122 and one or more conformal layers 120 may therefore be formed as illustrated in FIG. 13A.

Figure 14B:
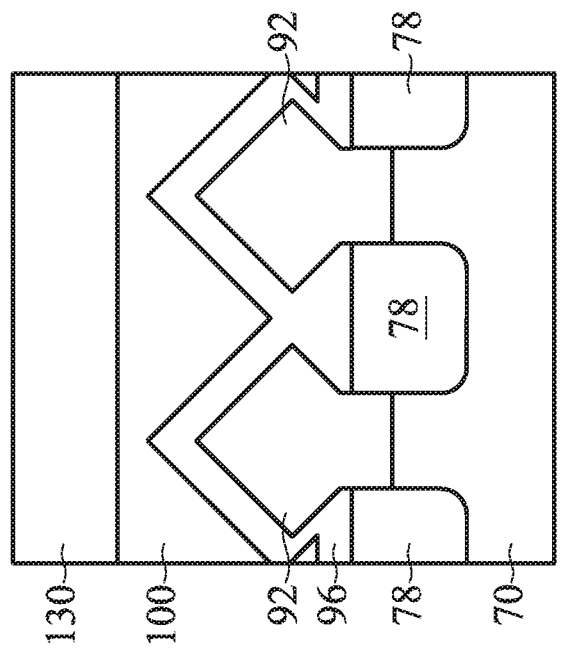
Figure 14A:
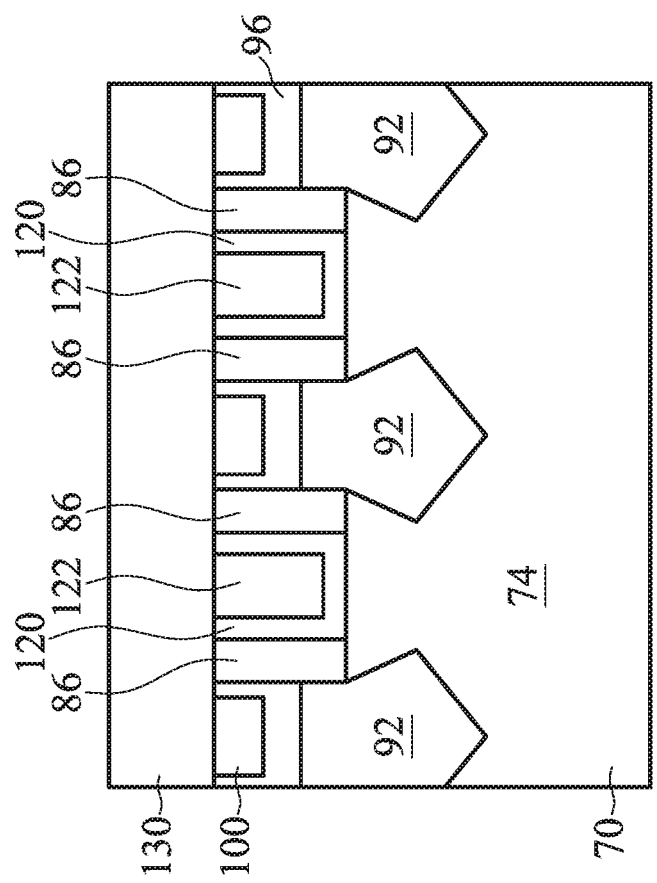

FIGS. 14A and 14B illustrate the formation of a second ILD 130 over the first ILD 100, replacement gate structures, gate spacers 86, and differential CESL 96. Although not illustrated, in some examples, an etch stop layer (ESL) may be deposited over the first ILD 100, etc., and the second ILD 130 may be deposited over the ESL. If implemented, the etch stop layer may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

Figure 15B:
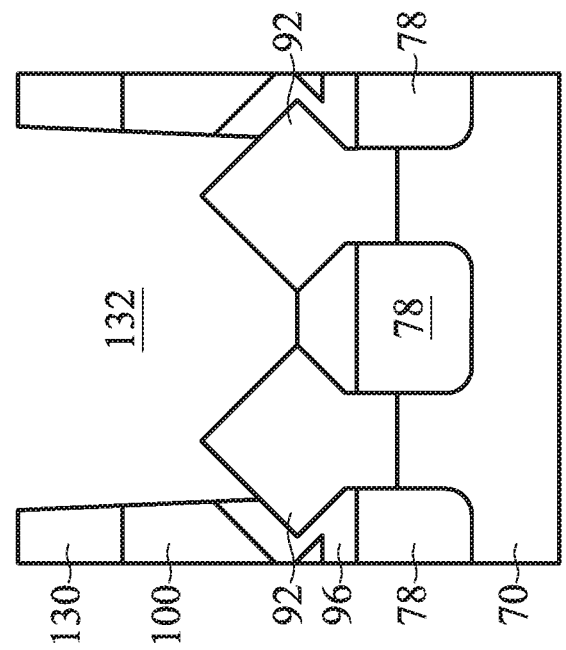
Figure 15A:
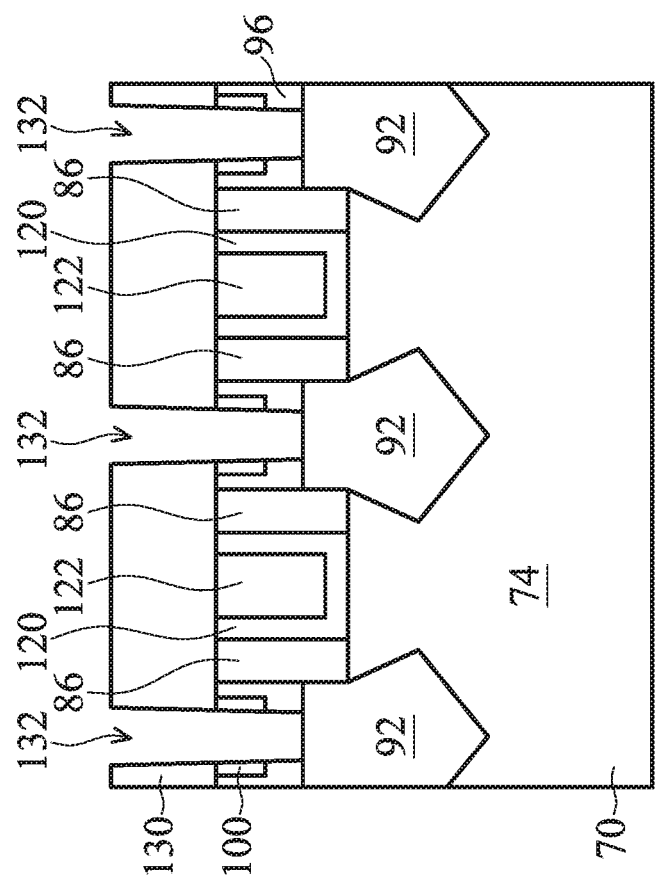

FIGS. 15A and 15B illustrate the formation of openings 132 through the second ILD 130, the first ILD 100, and the differential CESL 96 to the epitaxy source/drain regions 92 to expose at least portions of the epitaxy source/drain regions 92, as an example. The second ILD 130, the first ILD 100, and the differential CESL 96 may be patterned with the openings 132, for example, using photolithography and one or more etch processes.

Figure 16A:
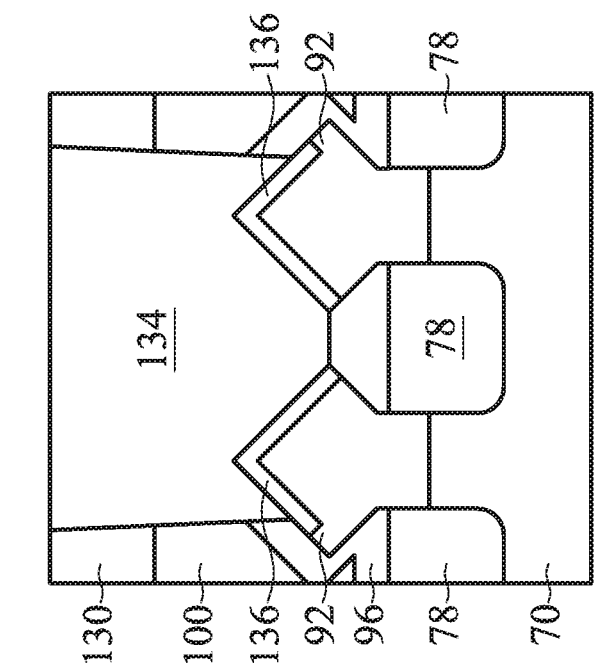
Figure 16B:
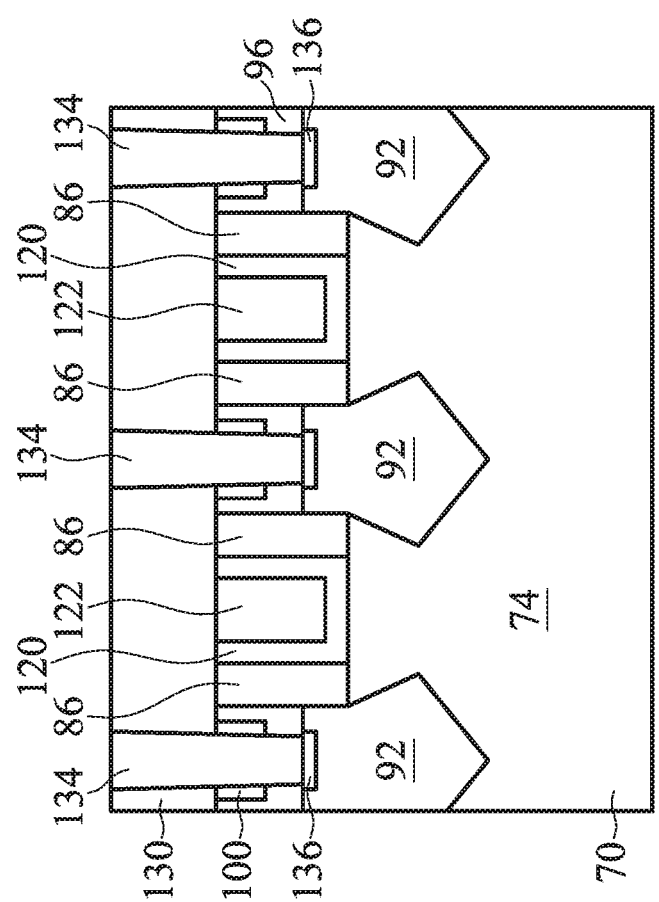

FIGS. 16A and 16B illustrate the formation of conductive features 134 in the openings 132 to the epitaxy source/drain regions 92. The conductive features 134 may include an adhesion and/or barrier layer and conductive material on the adhesion and/or barrier layer, for example. In some examples, the conductive features 134 may include silicide regions 136 on the epitaxy source/drain regions 92, as illustrated. The adhesion and/or barrier layer can be conformally deposited in the openings 132 and over the second ILD 130. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions 136 may be formed on upper portions of the epitaxy source/drain regions 92 by reacting upper portions of the epitaxy source/drain regions 92 with the adhesion and/or barrier layer. An anneal can be performed to facilitate the reaction of the epitaxy source/drain regions 92 with the adhesion and/or barrier layer.

The conductive material can be deposited on the adhesion and/or barrier layer and fill the openings 132. The conductive material may be or comprise tungsten, copper, aluminum, gold, silver, alloys thereof, the like, or a combination thereof, and may be deposited by CVD, ALD, PVD, or another deposition technique. After the material of the conductive features 134 is deposited, excess material may be removed by using a planarization process, such as a CMP, for example. The planarization process may remove excess material of the conductive features 134 from above a top surface of the second ILD 130. Hence, top surfaces of the conductive features 134 and the second ILD 130 may be coplanar. The conductive features 134 may be or may be referred to as contacts, plugs, etc.

FIGS. 17 through 20 are cross-sectional views of respective intermediate structures at intermediate stages in an example Plasma Enhanced ALD (PEALD) process of forming a differential CESL in a semiconductor device in accordance with some embodiments. FIG. 21 is a flow chart of the example PEALD process of FIGS. 17 through 20 in accordance with some embodiments. Although described in the context of a differential CESL, the example PEALD process can be used to form any layer, such as a layer that is not an ESL.

Figure 17:
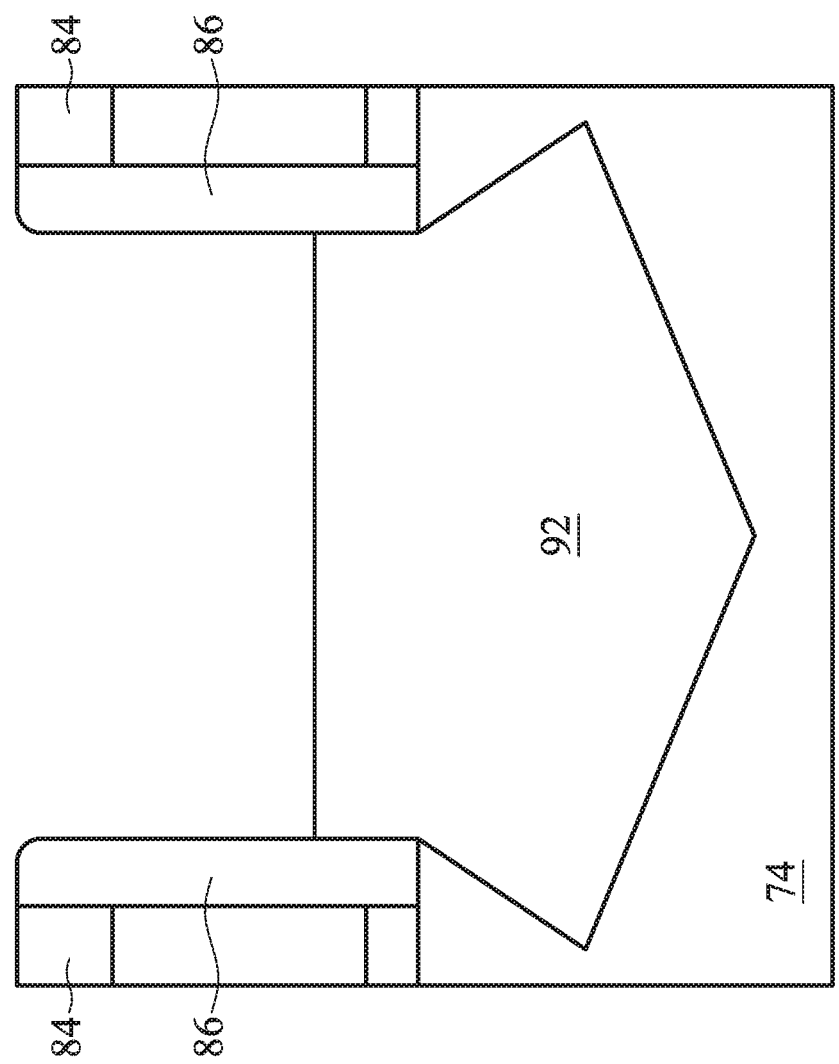
FIGS. 17, 18, 19, and 20 are cross-sectional views of respective intermediate structures at intermediate stages in an example Plasma Enhanced Atomic Layer Deposition (PEALD) process of forming a differential Contact Etch Stop Layer (CESL) in a semiconductor device in accordance with some embodiments.

FIG. 17 illustrates a portion of the intermediate structure formed through the processing described above with respect to FIGS. 2A-B through 8A-B. The intermediate structure includes a semiconductor substrate with a fin 74, an epitaxy source/drain region 92 in the fin 74 and laterally between gate spacers 86, and gate stacks that include a mask 84 along the gate spacers 86.

Figure 18:
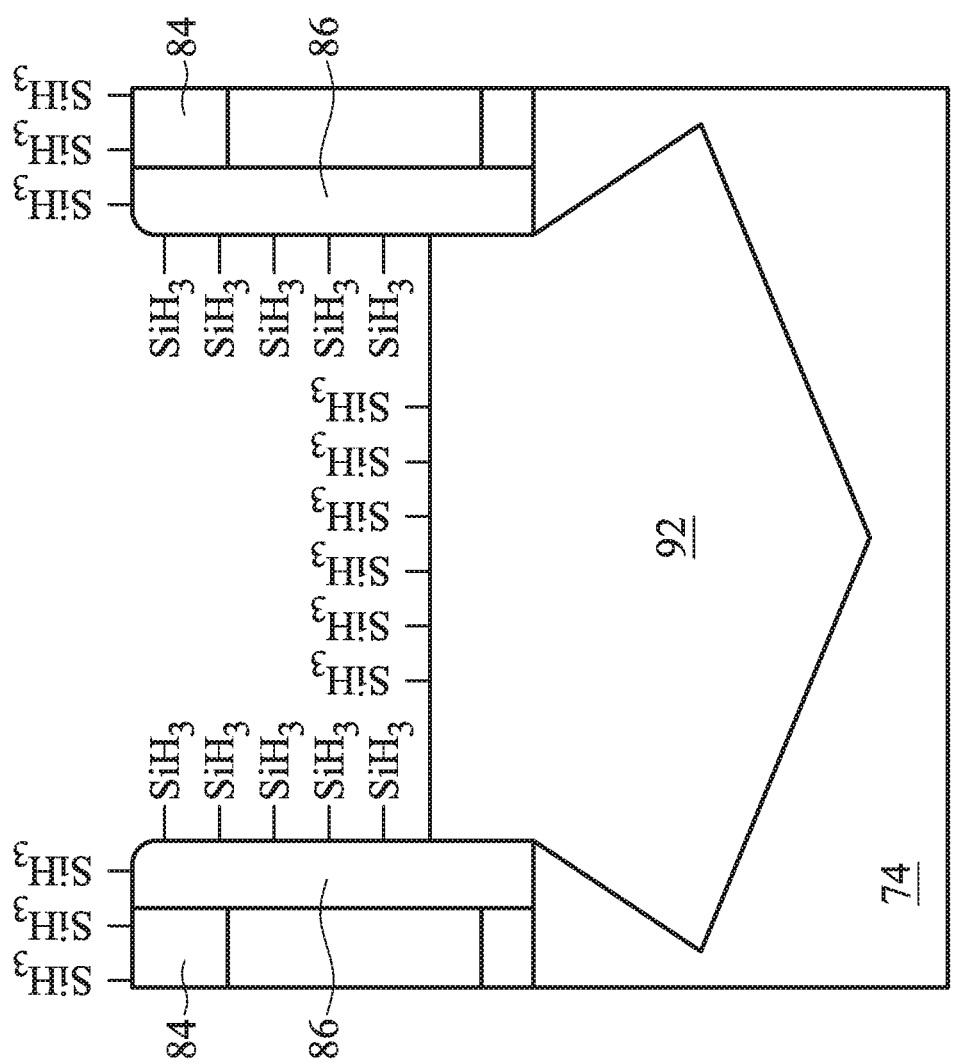

FIG. 18 illustrates a monolayer formed on the intermediate structure by exposure to a first precursor in the PEALD process, such as in operation 202 of FIG. 21. The intermediate structure of FIG. 17 is exposed to a first precursor, such as dichlorosilane $SiH_2Cl_2$ (DCS) or another precursor depending on the material to be deposited, for example. In the illustrated example, a DCS precursor is used and forms a monolayer of $SiH_3$ along exterior surfaces of the intermediate structure exposed to the DCS precursor. The exterior surfaces include top surfaces of the mask 84, sidewall and top surfaces of gate spacers 86, upper surfaces of the epitaxy source/drain regions 92, and top surfaces of isolation regions 78 (see, e.g., FIGS. 8B and 9B). In other examples, a different precursor may be used, which may form a monolayer of a different material. Following exposure to the first precursor, the first precursor may be purged from the tool chamber used to expose the intermediate structure to the first precursor.

Figure 19:
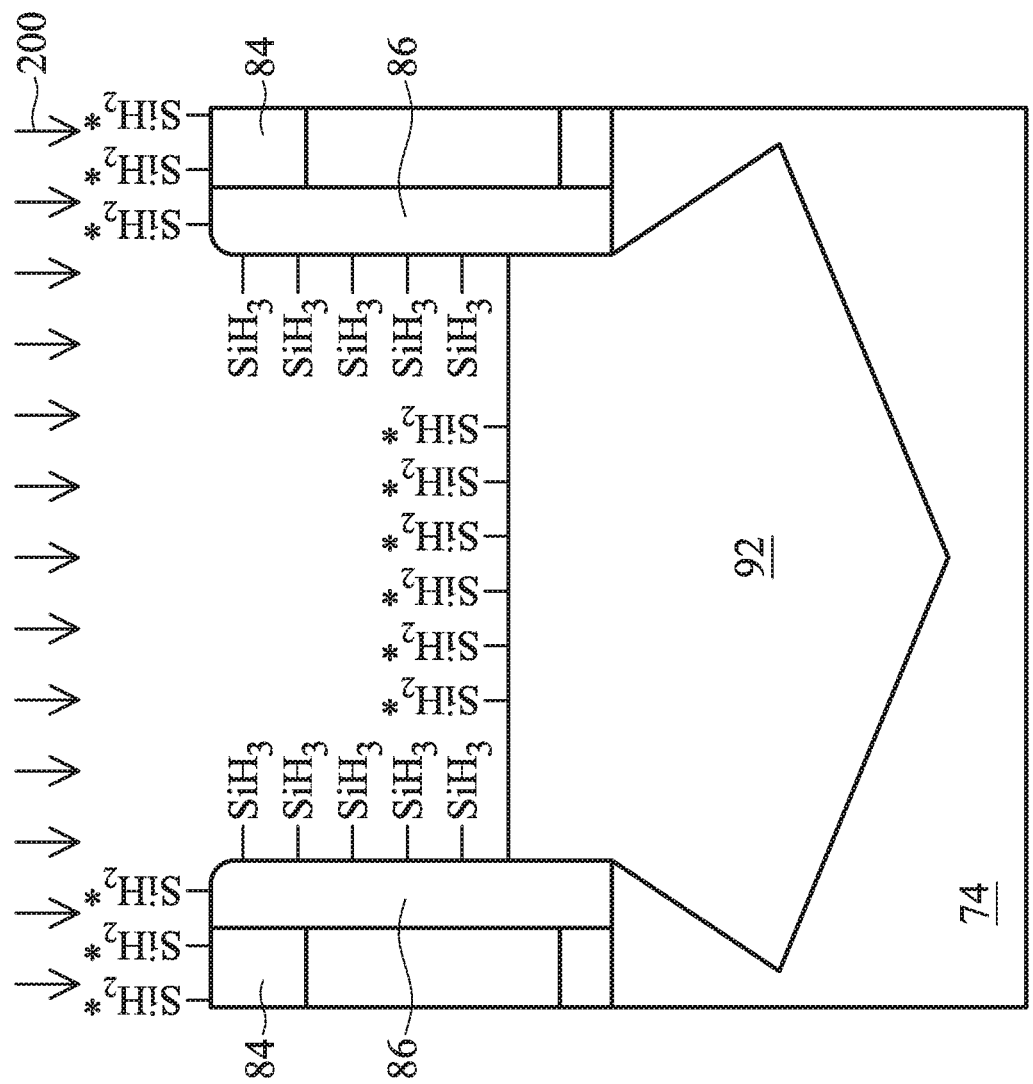

FIG. 19 illustrates a directional plasma activation 200 performed on the monolayer, such as in operation 204 of FIG. 21. The directional, or anisotropic, plasma activation 200 activates portions of the monolayer for increased reactions with a subsequent precursor. Portions of the monolayer on respective upper surfaces of the intermediate structure that have horizontal components are activated by the directional plasma activation 200, whereas portions of the monolayer on respective surfaces that do not have a horizontal component may not be activated by the directional plasma activation 200. Activation of surfaces may increase based on an increased horizontal component of the surface. For example, surfaces with no or little horizontal component can have no or little activation, whereas surfaces with a greater horizontal component can have a greater activation.

In the illustrated example, the upper surfaces of the epitaxy source/drain regions 92 are faceted such that the respective upper surfaces of the epitaxy source/drain regions 92 have a horizontal component and a vertical component, as illustrated in FIG. 8B, for example. The monolayer on these upper surfaces of the epitaxy source/drain regions 92 are activated by the directional plasma activation 200. The sidewalls of the gate spacers 86, as illustrated, are vertical without a significant horizontal component, and hence, are not activated by the directional plasma activation 200.

As illustrated in FIG. 19, an argon (Ar) directional plasma activates portions of the monolayer on upper surfaces of the intermediate structure that have a horizontal component to modify the $SiH_3$ in those portions to activated $SiH_2^*$. In some examples, the plasma process implemented to activate the monolayer can be a microwave remote plasma, although other plasma sources, such as a direct plasma, may be implemented. A flow rate of the argon (Ar) gas for the plasma can be in a range from about 1,000 sccm to about 9,000 sccm. A pressure of the plasma process can be in a range from about 0.5 Torr to about 50 Torr. A temperature of the plasma process can be in a range from about 200° C. to about 650° C. A power of the plasma generator of the plasma process can be in a range from about 50 W to about 4,000 W. A frequency of the plasma generator can be in a range from about 13.56 MHz to about 2.45 GHz. A substrate holder of the plasma process can be unbiased. A duration of the exposure of the intermediate structure to the plasma process can be in a range from 0.1 second to 120 seconds. In other examples, a different plasma, such as a different plasma process, conditions, and/or gas (such as an inert gas, nitrogen gas, or the like), may be used to activate portions of the monolayer. By activating the portions of the monolayer with the directional plasma activation 200, more reaction sites may be created on the activated portions of the monolayer to react with a subsequent precursor in the PEALD process. The directional plasma activation 200 may be performed in situ in the same tool chamber used to expose the intermediate structure to the first precursor and, subsequently, a second precursor.

Figure 20:
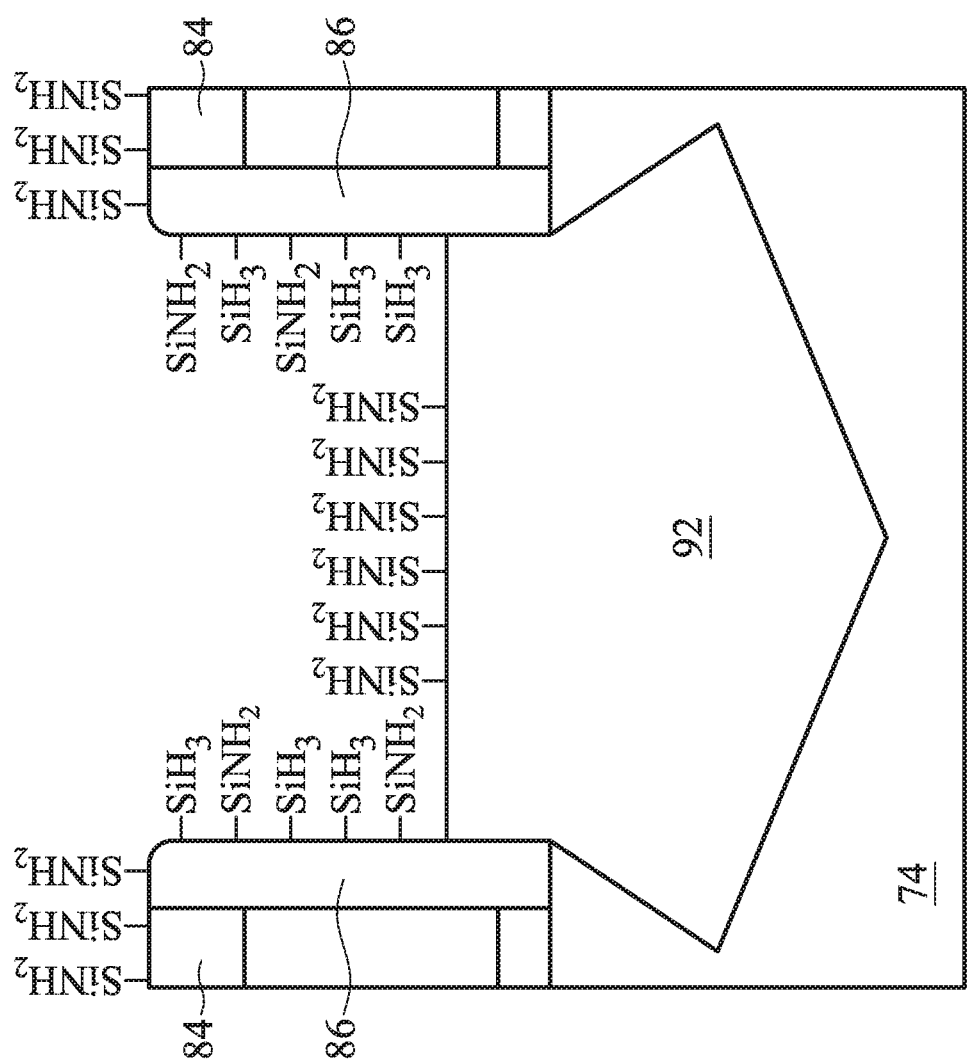
Figure 21:
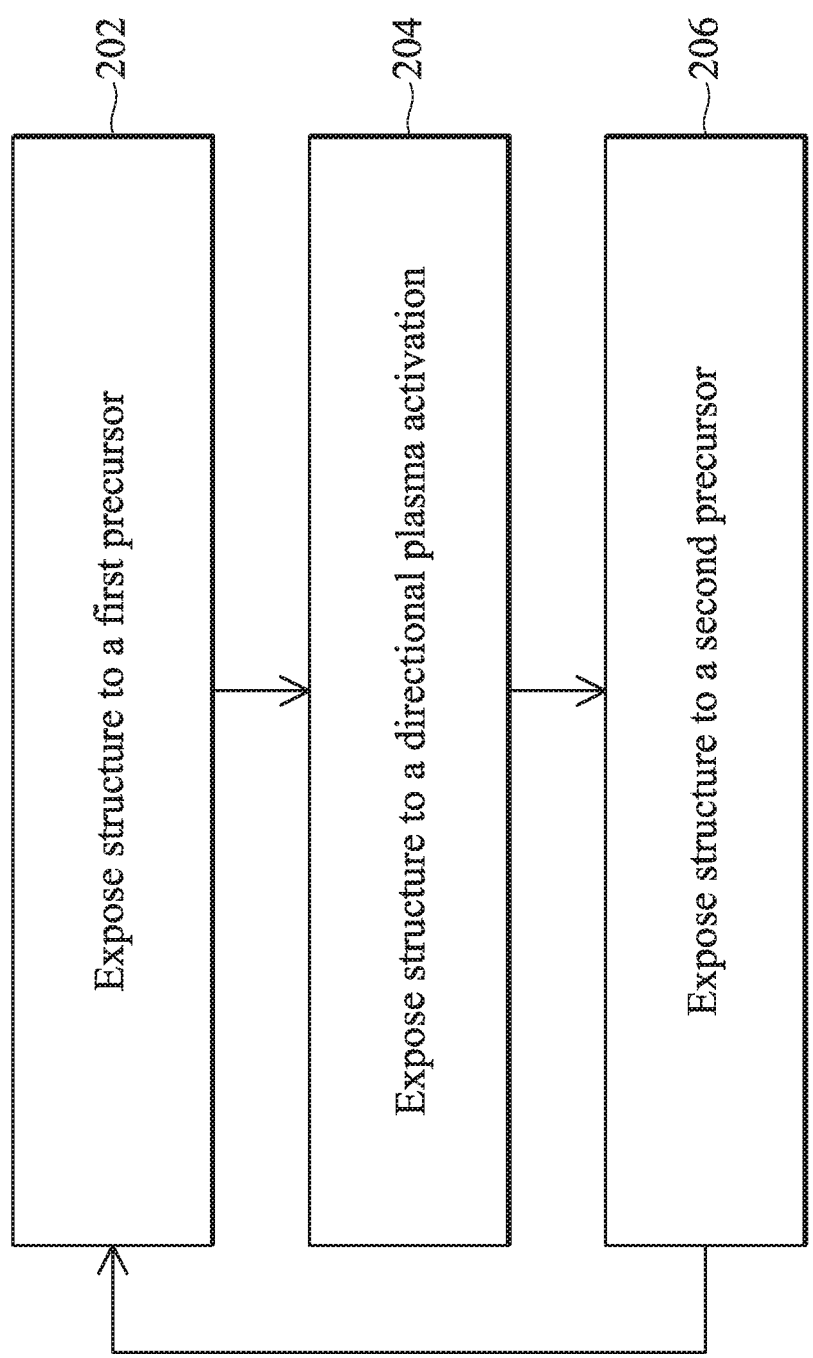
FIG. 21 is a flow chart of the example PEALD process of FIGS. 17 through 20 in accordance with some embodiments.

FIG. 20 illustrates a layer formed on the intermediate structure by exposure to a second precursor in the PEALD process, such as in operation 206 of FIG. 21. The intermediate structure of FIG. 19 is exposed to a second precursor, such as an ammonia ($NH_3$) plasma or another precursor depending on the material to be deposited, for example. The second precursor reacts with activated portions of the monolayer more than portions of the monolayer that are not activated. For example, due to the increased reaction sites formed on the activated portions of the monolayer from the directional plasma activation 200, more reactions between the monolayer at the activated portions and the second precursor will occur than between the monolayer at the non-activated portions and the second precursor. This causes the differential CESL 96 to be deposited at a greater rate on upper surfaces having a horizontal component, where activation occurs, than on vertical surfaces that do not have a significant horizontal component, where activation generally does not occur.

In the illustrated example of FIG. 20, an ammonia ($NH_3$) plasma precursor is used and reacts with most, or in some instances, all, of the activated $SiH_2^*$ and some of the non-activated $SiH_3$ (e.g., less than the activated $SiH_2^*$) to form silicon nitride (e.g., $SiNH_2$). For example, an ammonia ($NH_3$) precursor gas can be flowed in the plasma process at a flow rate in a range from about 50 sccm to about 1,000 sccm. Hence, in the illustrated example, more $SiNH_2$ is deposited on upper surfaces having a horizontal component than on vertical surfaces that do not have a significant horizontal component. In other examples, a different precursor may be used, which may form a layer of a different material. Following exposure to the second precursor, the second precursor may be purged from the tool chamber used to expose the intermediate structure to the second precursor.

FIGS. 18 through 20, and operations 202, 204, and 206 of FIG. 21, illustrate a cycle of the PEALD process. The processing described with respect to FIGS. 18 through 20, and operations 202, 204, and 206 of FIG. 21, may be repeated any number of times, e.g., any number of cycles of the PEALD process may be implemented, such as illustrated by the looping in the flow of FIG. 21, to achieve a differential CESL 96 having desired thicknesses.

Figure 22:
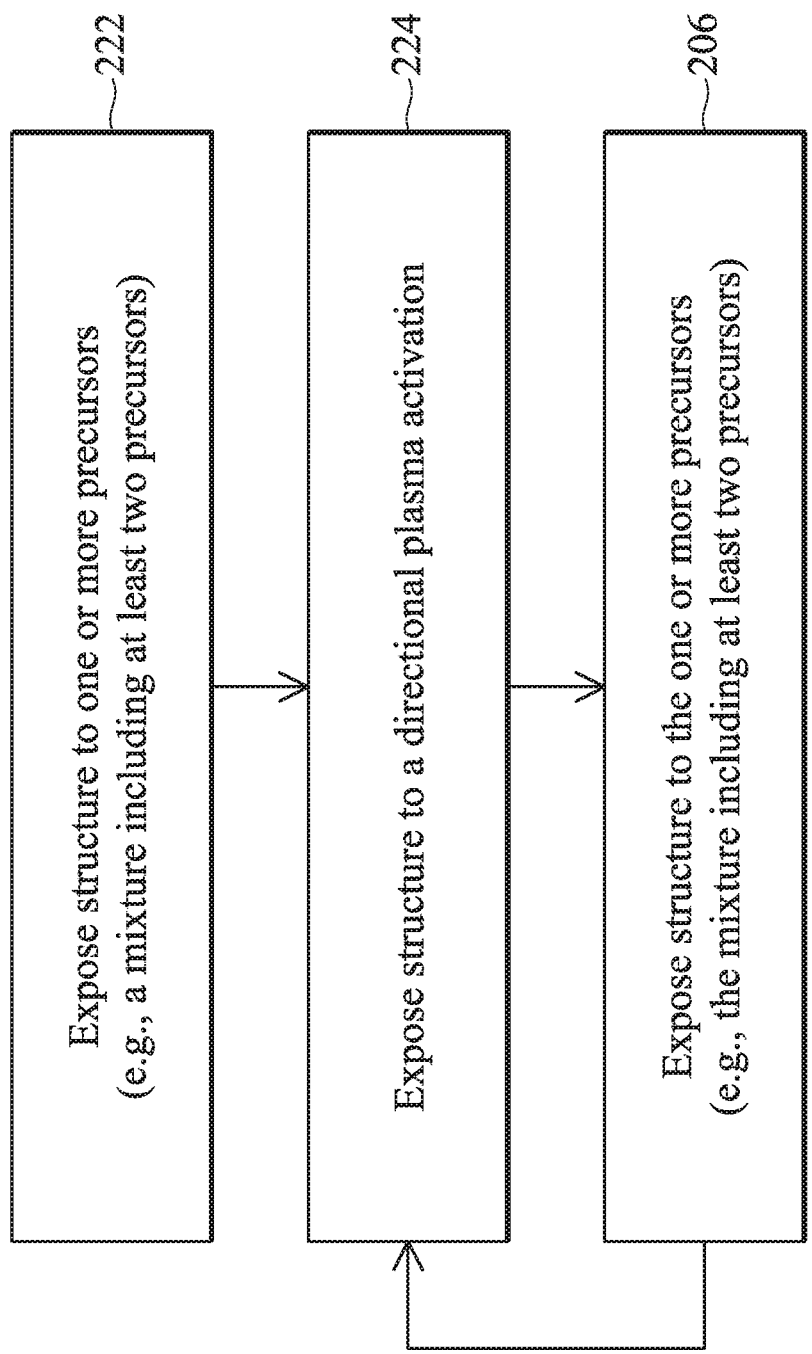
FIG. 22 is a flow chart of the example Chemical Vapor Deposition (CVD) process with in situ plasma activation in accordance with some embodiments.

In other examples, a CVD process with in situ plasma activation may be used for forming a differential CESL in a semiconductor device in accordance with some embodiments. FIG. 22 is a flow chart of the example CVD process with in situ plasma activation in accordance with some embodiments. Although described in the context of a differential CESL, the example CVD process can be used to form any layer, such as a layer that is not an ESL.

For example, the intermediate structure of FIG. 17 may be transferred into a chamber of a CVD tool, and one or more precursors (e.g., a mixture including at least two precursors) are provided in the chamber of the CVD tool, as in operation 222 of FIG. 22. By exposing the structure to the one or more precursors in the chamber, a layer may begin being deposited. The structure may be exposed to the one or more precursors for some duration less than a duration for depositing a layer with a finished thickness. The one or more precursors may be purged from the chamber of the CVD tool.

After purging the one or more precursors, a directional plasma activation is performed on the intermediate structure in the chamber of the CVD tool, as in operation 224 of FIG. 22. The directional, or anisotropic, plasma activation activates upper surfaces of the portion of the layer that was deposited that have a horizontal component for increased reactions with reactants of one or more precursors (e.g., two or more precursors). Respective upper surfaces of the portion of the layer that have horizontal components are activated by the directional plasma activation, whereas respective surfaces that do not have a horizontal component may not be activated by the directional plasma activation, similar to what was described with respect to FIG. 19. For example, the upper surfaces of the portion of the layer on the epitaxy source/drain regions 92 are activated by the directional plasma activation, whereas surfaces of the portion of the layer on the sidewalls of the gate spacers 86 are vertical without a significant horizontal component and are not activated by the directional plasma activation. By activating the upper surfaces that have a horizontal component with the directional plasma activation, more reaction sites may be created on the activated upper surfaces to react with a reactant of one or more subsequent precursors in the CVD process.

After the directional plasma activation, one or more precursors (e.g., the mixture including at least two precursors) are provided, as in operation 226 of FIG. 22, in the chamber of the CVD tool. Gas phase reactions may occur that provide reactants to surfaces on the intermediate structure. Activated upper surfaces provide more reaction sites for adsorption of and reaction with the reactants than non-activated surfaces. This causes the differential CESL 96 to be deposited at a greater rate on upper surfaces having a horizontal component, where activation occurs, than on vertical surfaces that do not have a significant horizontal component, where activation generally does not occur.

In some examples, periodically, the one or more precursors may be purged from the chamber of the CVD tool, and a directional plasma activation may be performed in situ in the chamber of the CVD tool. Thereafter, the one or more precursors can be provided in the chamber of the CVD tool. By repeating the directional plasma activation in this manner, such as illustrated by the looping in the flow of FIG. 22, deposition rates on horizontal surfaces and on vertical surfaces may remain more proportional. The processing of performing a directional plasma activation, providing one or more precursors, and purging the one or more precursors may be repeated any number of times.

Figure 23:
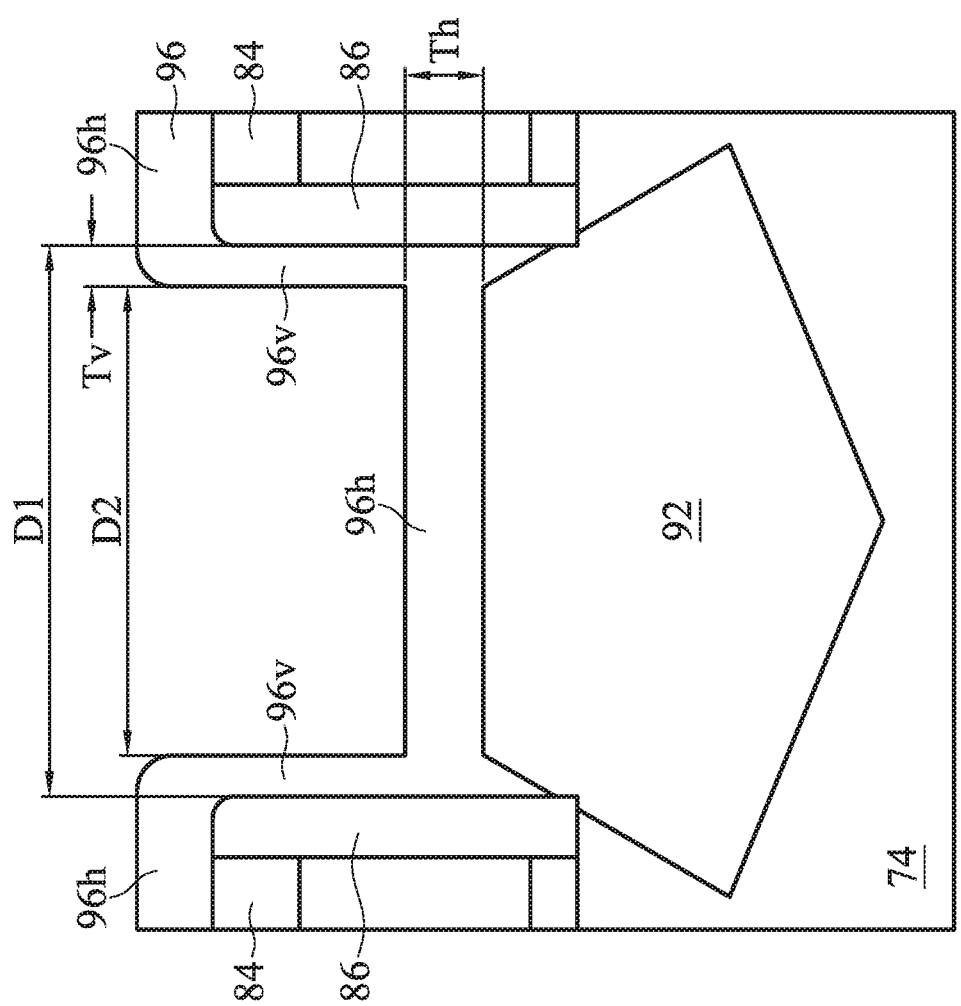
FIG. 23 is a cross-sectional view of a differential CESL in a semiconductor device in accordance with some embodiments.

FIG. 23 illustrates aspects of the differential CESL 96 formed using the PEALD process of FIGS. 18 through 20, the CVD process with in situ directional plasma activation, or another differential deposition process. The differential CESL 96 includes horizontal portions 96h on underlying upper surfaces having a horizontal component and includes vertical portions 96v on supporting vertical surfaces that do not have a significant horizontal component. The horizontal portions 96h have a thickness Th in a direction perpendicular to the supporting surface on which the respective horizontal portion is formed. The vertical portions 96v have a thickness Tv in a direction perpendicular to the supporting surface on which the respective horizontal portion is formed. The thickness Th of the horizontal portions 96h is greater than the thickness Tv of the vertical portions 96v. In some examples, the thickness Th of the horizontal portions 96h is at least 2 nm more than the thickness Tv of the vertical portions 96v. For example, the thickness Th of the horizontal portions 96h can be 4 nm, and the thickness Tv of the vertical portions 96v can be 2 nm. In some examples, a ratio of the thickness Th of the horizontal portions 96h to and the thickness Tv of the vertical portions 96v can be equal to or greater than 2.

A first dimension D1 is illustrated between facing sidewall surfaces of gate spacers 86 on which respective vertical portions 96v of the differential CESL 96 are formed. A second dimension D2 is illustrated between facing surfaces of vertical portions 96v of the differential CESL 96. Generally, the first dimension D1 is equal to the second dimension D2 plus two times the thickness Tv of the vertical portions 96v.

Some embodiments may achieve advantages. In some implementations, the process window for forming a conductive feature (e.g., conductive feature 104 or 134 in FIGS. 12A and 16A) may be increased because the second dimension D2 may be increased by reducing the thickness Tv of the vertical portions 96v when compared to a CESL with a uniform thickness throughout. In other implementations, for a given process window in which to form a conductive feature (which may determine a minimum second dimension D2), the differential CESL 96 may permit for an increased thickness Th of horizontal portions 96h, an increased width of the gate spacers 86 (e.g., in the direction of the second dimension D2), and/or an increased gate stack width when compared to a CESL with a uniform thickness throughout. If a width of the gate spacers 86 is relatively small, for example, the thickness Tv of the vertical portions 96v may be relatively large, which may permit the thickness Th of the horizontal portions 96h to be proportionally larger. This can permit for greater protection of the epitaxy source/drain regions 92 and/or etch stop capability during an etch process that forms openings (e.g., openings 102 or 132 in FIGS. 11A-B and 15A-B) for conductive features, for example. This can also permit for greater protection of the epitaxy source/drain regions 92 from oxidation. If the thickness Tv of the vertical portions 96v is relatively small, for example, a width of the gate spacers 86 may be relatively large, which may permit more spacer material, such as a low-k material, for the gate spacers 86 to improve device performance by decreasing resistance-capacitance (RC) delay. If the width of the gate spacers 86 and thickness Th of horizontal portions 96h remain the same compared to corresponding structures in a uniform CESL process, the thickness Tv of the vertical portions 96v may be reduced, which can permit an increased width of the gate stacks (e.g., parallel to a channel length direction between corresponding epitaxy source/drain regions 92). Various permutations and combinations of dimensions and thicknesses may be achieved to permit various advantages to be achieved.

An embodiment is a structure. The structure includes an active area on a substrate, a gate structure over the active area, a gate spacer along a sidewall of the gate structure, and a differential etch stop layer. The active area includes a source/drain region, and the source/drain region is proximate the gate structure. The differential etch stop layer has a first portion along a sidewall of the gate spacer and has a second portion over an upper surface of the source/drain region. A first thickness of the first portion is in a direction perpendicular to the sidewall of the gate spacer, and a second thickness of the second portion is in a direction perpendicular to the upper surface of the source/drain region. The second thickness is greater than the first thickness.

Another embodiment is a method of semiconductor processing. A differential layer is formed over a device structure on a substrate. In a first exposure, the device structure is exposed to first one or more precursors. After the first exposure, an upper surface on the device structure is activated using a directional plasma activation. After activating the upper surface on the device structure, in a second exposure, the device structure is exposed to second one or more precursors. More reactions occur at the activated upper surface on the device structure than at a non-activated surface on the device structure while the device structure is exposed to the second one or more precursors.

A further embodiment is a method of semiconductor processing. A differential etch stop layer is formed having a first portion over an upper surface of a source/drain region and a second portion along a sidewall of a gate spacer. The source/drain region is in an active area, and the gate spacer is over the active area proximate the source/drain region. A thickness of the first portion is greater than a thickness of the second portion. Forming the differential etch stop layer includes performing a directional activation. An interlayer dielectric (ILD) is deposited over the differential etch stop layer. A conductive feature is formed through the ILD and the differential etch stop layer and contacting the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor processing comprising:
    forming a differential layer over a device structure on a substrate, forming the differential layer comprising:
        exposing, in a first exposure, the device structure to first one or more precursors;
        after the first exposure, activating an upper surface on the device structure using a directional plasma activation; and
        after activating the upper surface on the device structure, exposing, in a second exposure, the device structure to a second one or more precursors, wherein more reactions occur at the activated upper surface on the device structure than at a non-activated surface on the device structure while the device structure is exposed to the second one or more precursors, wherein the non-activated surface is exposed to the second one or more precursors during the exposing the device structure to the second one or more precursors, wherein the first one or more precursors include a first precursor that is not included in the second one or more precursors, wherein the second one or more precursors include a second precursor that is not included in the first one or more precursors, and wherein:
            the first precursor is dichlorosilane (DCS); and
            the second precursor is ammonia, and the second exposure includes a plasma.

2. The method of claim 1, wherein:
    during the first exposure, the first precursor reacts with an upper surface and a sidewall surface of the device structure, the upper surface of the device structure having a horizontal component; and
    the upper surface on the device structure that is activated is the reacted upper surface of the device structure.

3. The method of claim 1, wherein forming the differential layer comprises using an Atomic Layer Deposition (ALD) process.

4. The method of claim 1, wherein:
    the first one or more precursors include at least two precursors;
    during the first exposure, the at least two precursors react to form a portion of the differential layer on an upper surface and a sidewall surface of the device structure, the upper surface of the device structure having a horizontal component;
    the upper surface on the device structure that is activated is an upper surface of the portion of the differential layer on the upper surface of the device structure; and
    the second one or more precursors include the at least two precursors.

5. The method of claim 1, wherein forming the differential layer comprises using a Chemical Vapor Deposition (CVD) process, wherein the directional plasma activation is performed in situ with the CVD process.

6. The method of claim 1, wherein forming the differential layer forms a first portion of the differential layer along the upper surface on the device structure and forms a second portion of the differential layer along the non-activated surface on the device structure, the first portion of the differential layer having a first thickness perpendicular to the upper surface on the device structure, the second portion of the differential layer having a second thickness perpendicular to the non-activated surface on the device structure, the first thickness being greater than the second thickness.

7. The method of claim 1, wherein the device structure comprises:
    an active area on the substrate, the active area comprising a source/drain region; and
    a gate spacer over the active area adjoining the source/drain region, the upper surface on the device structure being along a upper surface of the source/drain region, the non-activated surface on the device structure being along a sidewall surface of the gate spacer.

8. The method of claim 7, wherein the active area is in a fin on the substrate, and the source/drain region is an epitaxy source/drain region.

9. The method of claim 1, wherein the directional plasma activation comprises:
 a flow rate of an argon gas in a range from about 1,000 sccm to about 9,000 sccm;
 a pressure of the directional plasma activation in a range from about 0.5 Torr to about 50 Torr; and
 a temperature of the directional plasma activation in a range from about 200° C. to about 650° C.

10. The method of claim 9, wherein the directional plasma activation comprises:
 a power of a plasma generator of the directional plasma activation in a range from about 50W to about 4,000 W; and
 a frequency of the plasma generator of the directional plasma activation in a range from about 13.56 MHz to about 2.45 GHz.

11. A method of semiconductor processing comprising:
 forming a differential etch stop layer having a first portion over an upper surface of a source/drain region and a second portion along a sidewall of a gate spacer, the source/drain region being in an active area, the gate spacer being over the active area proximate the source/drain region, a thickness of the first portion being greater than a thickness of the second portion, forming the differential etch stop layer comprising performing a directional;
activation, wherein the forming the differential etch stop layer comprises using a first precursor of dichlorosilane and using a second precursor of ammonia;
 depositing an interlayer dielectric (ILD) over the differential etch stop layer; and
 forming a conductive feature through the ILD and the differential etch stop layer and contacting the source/drain region.

12. The method of claim 11, wherein the directional activation is a plasma directional activation.

13. The method of claim 11, wherein forming the differential etch stop layer comprises:
 exposing, in a tool chamber in a first exposure, the upper surface of the source/drain region and the sidewall of the gate spacer to the first precursor to form respective reacted surfaces along the upper surface of the source/drain region and the sidewall of the gate spacer;
 after the first exposure, purging the first precursor from the tool chamber;
 after purging the first precursor, performing, in the tool chamber, the directional activation to activate the reacted surface along the upper surface of the source/drain region; and
 after performing the directional activation, exposing, in the tool chamber in a second exposure, the activated, reacted surface along the upper surface of the source/drain region and the reacted surface along the sidewall of the gate spacer to the second precursor, the second precursor not being included in the first exposure, the first precursor not being included in the second exposure.

14. The method of claim 11, wherein forming the differential etch stop layer comprises using an Atomic Layer Deposition (ALD) process.

15. The method of claim 11, wherein forming the differential etch stop layer comprises:
 exposing, in a tool chamber in a first exposure, the upper surface of the source/drain region and the sidewall of the gate spacer to at least two precursors to form a portion of the differential etch stop layer along the upper surface of the source/drain region and the sidewall of the gate spacer;
 after the first exposure, performing, in the tool chamber, the directional activation to activate the portion of the differential etch stop layer along the upper surface of the source/drain region; and
 after performing the directional activation, exposing, in the tool chamber, the activated portion of the differential etch stop layer along the upper surface of the source/drain region and the portion of the differential etch stop layer along the sidewall of the gate spacer to the at least two precursors.

16. The method of claim 11, wherein forming the differential etch stop layer comprises using a Chemical Vapor Deposition (CVD) process with the directional activation being performed in situ in the CVD process.

17. A method of semiconductor processing comprising:
 forming a contact opening extending through one or more dielectric layers, the contact opening exposing contact region of a substrate;
 forming a first monolayer on horizontal surfaces and vertical surfaces of the contact opening, the forming the first monolayer using a first precursor of dichlorosilane;
 performing a directional plasma process on the first monolayer to form an activated first monolayer, unactivated portions of the first monolayer remaining after the directional plasma process, the directional plasma process activating more of the horizontal surfaces of the first monolayer than vertical surfaces of the first monolayer;
 exposing the activated first monolayer and the unactivated portion of the first monolayer to a second precursor, the second precursor comprising ammonia, the second precursor reacting with the activated first monolayer at a faster rate than the second precursor reacts with the unactivated portions of the first monolayer; and
 repeating the forming the first monolayer, the performing the directional plasma process, and the exposing one or more times.

18. The method of claim 17, wherein the contact region comprises an epitaxial source/drain region.

19. The method of claim 17, wherein the directional plasma process comprises an argon plasma process.

20. The method of claim 19, wherein the directional plasma process comprises:
 a flow rate of an argon gas in a range from about 1,000 sccm to about 9,000 sccm;
 a pressure of the directional plasma process in a range from about 0.5 Torr to about 50 Torr;
 a temperature of the directional plasma process in a range from about 200° C. to about 650° C.;
 a power of a plasma generator of the directional plasma process in a range from about 50 W to about 4,000 W; and
 a frequency of the plasma generator of the directional plasma process in a range from about 13.56 MHz to about 2.45 GHz.

* * * * *